US008305139B1

(12) United States Patent
Dykstra

(10) Patent No.: US 8,305,139 B1
(45) Date of Patent: Nov. 6, 2012

(54) METHODS AND APPARATUSES FOR HIGH POWER AND/OR HIGH FREQUENCY DEVICES

(75) Inventor: Jeffrey A. Dykstra, Woodstock, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 13/253,832

(22) Filed: Oct. 5, 2011

(51) Int. Cl.
*H03F 1/14* (2006.01)

(52) U.S. Cl. .......... 330/51; 330/311; 330/302; 327/359; 455/326

(58) Field of Classification Search .................... 330/51, 330/311, 302; 327/359, 157; 455/326
See application file for complete search history.

(56) References Cited

U.S. PATENT DOCUMENTS

| | | | | |
|---|---|---|---|---|
| 7,489,202 | B1* | 2/2009 | Griffiths et al. | 330/311 |
| 2006/0194567 | A1* | 8/2006 | Kelly et al. | 455/408 |
| 2011/0025404 | A1* | 2/2011 | Cassia | 327/436 |
| 2011/0043271 | A1* | 2/2011 | Ranta et al. | 327/427 |
| 2011/0102070 | A1* | 5/2011 | Chen et al. | 327/536 |
| 2011/0241782 | A1* | 10/2011 | Clifton | 330/295 |
| 2012/0098579 | A1* | 4/2012 | Schober et al. | 327/157 |

* cited by examiner

*Primary Examiner* — Patricia Nguyen
(74) *Attorney, Agent, or Firm* — Jaquez & Associates; Martin J. Jaquez, Esq.; Alessandro Steinfl, Esq.

(57) ABSTRACT

Driver circuits and methods related thereto for driving high power and/or high frequency devices are described. The driver circuits comprise transistor stacks and capacitors coupled with the transistor stacks. Voltages across the capacitors depend on state (on or off) of each transistor in the transistor stacks. These voltages in turn determine output voltages generated by the driver circuits.

20 Claims, 6 Drawing Sheets

METHODS AND APPARATUSES FOR HIGH POWER AND/OR HIGH FREQUENCY DEVICES

FIELD

The present disclosure relates to electronic devices. More particularly, the disclosure relates to methods and apparatuses for high power and/or high frequency devices.

SUMMARY

According to a first aspect of the disclosure, a circuital arrangement adapted to provide a first output voltage to a first output terminal and a second output voltage to a second output terminal is provided, comprising: a first transistor configured to receive a first control voltage; a second transistor configured to receive a second control voltage; a first capacitor connected with the first transistor on one end and the second transistor on another end; a third transistor configured to receive the second control voltage; a fourth transistor configured to receive the first control voltage; and a second capacitor connected with the third transistor on one end and the fourth transistor on another end, wherein: the first capacitor is configured to store charge when the first transistor is switched on and is configured to couple a first capacitor voltage to the first output terminal when the first transistor is switched off, wherein the first and second output voltages are functions of the first capacitor voltage when the first transistor is switched off, and the second capacitor is configured to store charge when the third transistor is switched on and is configured to couple a second capacitor voltage to the second output terminal when the third transistor is switched off, wherein the first and second output voltages are functions of the second capacitor voltage when the third transistor is switched off.

According to a second aspect of the disclosure, a method for providing a first output voltage and a second output voltage to a receiving circuit is provided, comprising: providing a first transistor, a second transistor, a third transistor, and a fourth transistor; providing a first capacitor connected with the first transistor on one end and the second transistor on another end; providing a second capacitor connected with the third transistor on one end and the fourth transistor on another end; applying a first control voltage to the first and fourth transistors, the first control voltage controlling state of the first and fourth transistors; applying a second control voltage to the second and third transistors, the second control voltage controlling state of the second and third transistors; generating the first output voltage based on voltage across the first capacitor; and generating the second output voltage based on voltage across the second capacitor, wherein the state of each transistor is either an on state or an off state.

Mixer circuits, amplifier circuits, and switching circuits utilizing the circuital arrangement according to the first aspect and the method according to the second aspect are also provided.

Further embodiments are provided in the specification, drawings, and claims of the present application.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

DETAILED DESCRIPTION

Figure 1A:
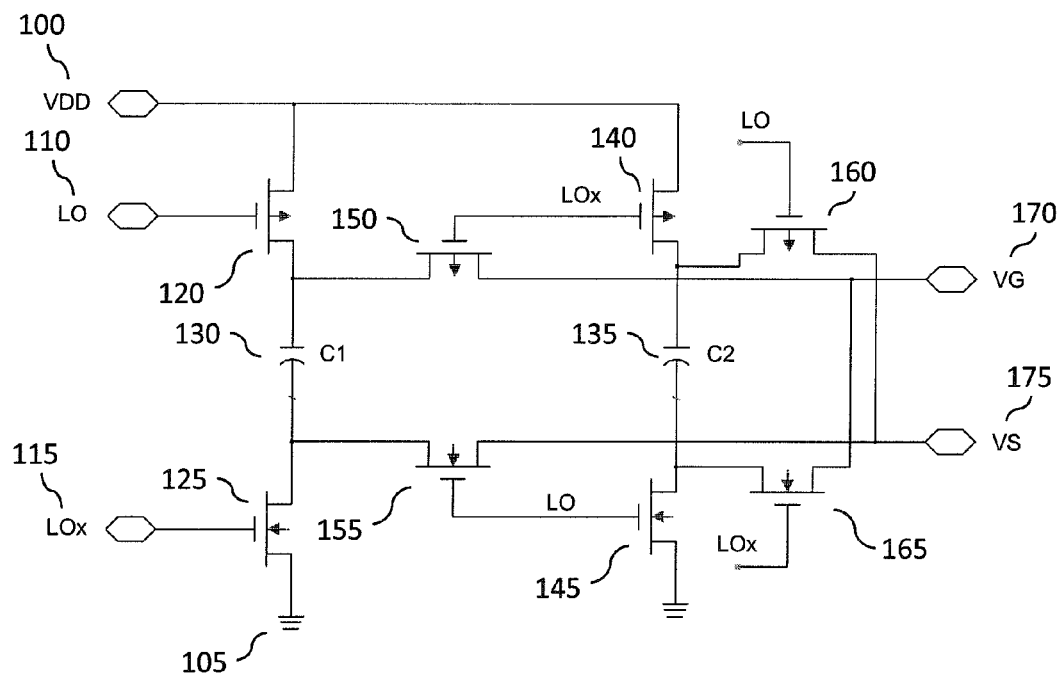
FIG. 1A shows an embodiment of a driver suitable for driving switching devices.

Reliability considerations of transistors affect maximum amount of voltage, also referred to as breakdown voltage or withstand voltage, that can be placed across terminals of any particular transistor. In a field effect transistor (FET), for instance, the withstand voltage is the maximum amount of voltage that can be placed from drain to source of any particular FET. Specifically, above the withstand voltage, the transistors used in implementing a system can break down, leaving the system unable to accomplish an intended purpose. A transistor stack where two or more transistors are serially connected can be utilized to allow the serially connected transistors to share a voltage applied to the transistor stack. For example, if each transistor has a withstand voltage of around 3 V, then a stack of five transistors would ideally be expected to have a withstand voltage of around 15 V. Losses in the transistors due to various parasitics, such as parasitic capacitances that conduct current in various (e.g., including undesirable) directions, would generally lead to a withstand voltage lower than the expected 15 V.

In a field effect transistor (FET), for instance, the withstand voltage of an individual FET can be increased by increasing gate length, although this leads to occupation of more area on a chip for the individual FET. The withstand voltage of the FET stack can be reduced due to parasitics such as parasitic capacitances that conduct current in the various (e.g., including undesirable) directions, which can result from, for instance, proximity between FET devices in the stack.

Although many embodiments of the present disclosure comprise FETs, it should be noted that bipolar junction transistors and other transistors identifiable by a person skilled in the art can be utilized in conjunction with or in place of FETs. Consequently, as used in this disclosure, the term "transistor" refers to field effect transistors, bipolar junction transistors, and other transistors identifiable by a person skilled in the art. As used in this disclosure, the terms "transistor stack" and "stacked transistors" can refer to a serial connection between at least two transistors. It should be noted, however, that a transistor stack can also refer to a stack of only one transistor.

According to many embodiments of the present disclosure, stacked transistors can be utilized in devices including but not limited to mixers, power amplifiers, and switches. For the purposes of discussion, the various devices are assumed to be adapted for operation at radio frequencies (RF) and thus reference can be made to "RF devices" and "RF signals/voltages" throughout the present disclosure. The devices can also operate at frequencies outside of the RF regime.

A driving circuit or driver can be utilized to provide a signal to each transistor in a transistor stack, also referred to as driving the transistors, to close (turn ON) or open (turn OFF) the transistors. The stacked transistors can allow higher input power to be handled by the various devices (e.g., mixers, power amplifiers, and switches), relative to the case where the various devices are implemented without stacking transistors.

In accordance with many embodiments of the present disclosure, the driver allows individually controlling each transistor (e.g., control of $V_{GS}$ in the case of a FET) in a transistor stack. Output impedance can be made large relative to impedance of capacitances of the transistors such that voltage sharing is not interrupted by the driver output impedance. In general, the transistors in the transistor stack are nominally the same (or very similar) such that the driver and transistor stack arrangement can be implemented to yield equal voltage sharing, if desired, between transistors in the transistor stack. As a result, the driver can allow switching of transistors when operating frequencies are high (e.g., local oscillator (LO) frequencies in mixers can generally be relatively high) while also allowing equal sharing of voltage between transistors in a transistor stack.

In a FET stack, for instance, an input voltage to the FET stack can be shared by each individual FET from drain to gate and then gate to source by capacitances inherent in each individual FET. When each of the FETs in the FET stack has the same capacitance, the input voltage can be shared equally among each FET in the FET stack. However, if an output impedance of the driver is low relative to impedance of the capacitances of the FETs, sharing of the voltage is interrupted by the driver impedance.

Consider a mixer that is to be driven by a driver, where the mixer comprises one or more FETs (referred to as mixer FETs). In some implementations of the driver for the mixer, output impedance of the driver driving a FET is low, relative to impedance of the capacitance of the FET, in order to yield a sufficiently large voltage swing for gate voltage $V_G$ to fully turn ON or OFF the FET even when a large RF signal is applied.

The low output impedance driver design may not allow a large input power associated with a large input voltage to be equally shared by the mixer FETs. Specifically, in an extreme case, the low output impedance driver design can cause most and possibly all of the input voltage to be applied across one of the mixer FETs in the FET stack, thus causing power handling to be limited by the withstand voltage from drain to source of a single mixer FET. This single mixer FET is generally that FET most closely coupled with the large input voltage. In other words, although number of FETs in the stack can be more than one in such a case, the effective number of FETs in the stack is one.

Reliability considerations of stacked transistors are important when the mixer is handling, by way of example and not of limitation, a high voltage or high power RF signal. Specifically, frequency dependency of parasitic capacitances affects voltage sharing of the transistor stack. The driver applies voltages of $+V_{DD}$ or $-V_{DD}$ (assumed to be relatively large voltages) to the mixer transistor to ensure that the mixer transistor is either fully ON or fully OFF, and further that voltage swing of the RF signal cannot change state (i.e., ON or OFF) of the mixer transistor. The driver voltage is generally large compared to a sum of thermal voltage $V_T$ of the mixer transistor and an RF voltage applied on the gate of the mixer transistor. An exemplary driver voltage is 3 V.

In other implementations of the driver, a large gate resistor $R_G$ can be tied to a gate of each mixer FET in a FET stack and used to drive each mixer FET. The large gate resistors are large in resistance value relative to input impedance of the gate of a mixer FET. The large gate resistors can be designed such that each FET shares a substantially equal portion of the input voltage. However, the large gate resistors may not allow gate voltage of each FET to follow the frequency of a local oscillator (LO) signal. Specifically, the gate voltage does not change rapidly enough to follow the LO input frequency since a time constant $\tau = R_G \times C_G$, where $C_G$ is a parasitic gate capacitance of the mixer FET, associated with the mixer FET is large. In other words, an RC filter formed by the large gate resistors $R_G$ and their respective parasitic capacitances $C_G$ can filter out signals at the LO input frequency and thus prevent the LO input frequency from passing to $V_{GS}$. The LO signal will thus be unable to control operation of the mixer FETs.

FIG. 1A shows an embodiment of a driver suitable for driving switching devices, such as transistors. Specifically, the driver is adapted to provide voltages $V_G$ (170) and $V_S$ (175) to a receiving circuit (not shown), which is generally a transistor. The driver comprises a plurality of transistors (120, 125, 140, 145, 150, 155, 160, 165) and a plurality of capacitors (130, 135). A gate of each transistor (120, 125, 140, 145, 150, 155, 160, 165) is adapted to receive either a first signal LO (110) or a second signal LOx (115). It should be noted that the designation "LO" standing for "local oscillator" is utilized for convenience. As stated throughout the present disclosure, the driver can be utilized for driving switching devices in devices such as amplifiers and switches, among others, in addition to mixers.

The LO signals (110, 115) are generally square signals switching between a high voltage state and a low voltage state. In general, the signals LO (110) and LOx (115) are complementary (e.g., logical inverses) of each other. Consequently, when the LO signal (110) is in a high voltage state, the LOx signal (115) is generally in a low voltage state, and vice versa. For instance, the high voltage state of the LO signals (110, 115) can be at $+V_{DD}$ while the low voltage state can be at ground.

When the LO signal (110) is in a low voltage state, and thus the LOx signal (115) is generally in a high voltage state, a first transistor (120) and a second transistor (125) are closed (switched ON). With the first and second transistors (120, 125) closed, a first capacitor (130) is charged such that voltage across the first capacitor (130) corresponds to the high voltage supply $V_{DD}$ (100).

When the LO signal (110) is in a high voltage state, a third transistor (140) and a fourth transistor (145) are closed (switched ON). With the third and fourth transistors (140, 145) closed, a second capacitor (135) is charged to the high voltage supply $V_{DD}$ (100).

In general and as is well known, losses associated with the transistors (120, 125, 140, 145) will decrease actual charge accumulated by the capacitors (130, 135). It should be noted that in either of these cases, depending on application of the driver, the first and second capacitors (130, 135) can be charged to less than the high voltage supply $V_{DD}$ (100).

The driver is generally designed such that the driver switches in a time duration comparable to time duration for capacitors (130, 135) to be recharged to $V_{DD}$. The driver drives one or more transistors in a transistor stack (not shown in FIG. 1A) at the LO input frequency and allows sharing with substantially equal voltage across each transistor in the transistor stack by utilizing auxiliary transistors (120, 125, 140, 145, 150, 155, 160, 165) to charge capacitors (130, 135) and allows placing charge associated with these capacitors (130, 135) across output terminals $V_G$ (170) and $V_S$ (175). These output terminals (170, 175) are adapted to be coupled with one or more transistors in a transistor stack (not shown in FIG. 1A).

Figure 1B:
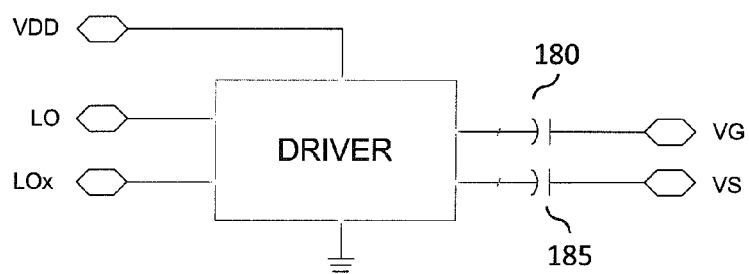
FIG. 1B shows a block diagram of the driver shown in FIG. 1A.

As previously mentioned, a receiving circuit, such as each transistor in a transistor stack, can be driven by a corresponding driver, where the driver is as shown in FIG. 1A. FIG. 1B shows a block diagram of the driver of FIG. 1A. As shown in FIG. 1B, the driver of FIG. 1A can further comprise DC blocking capacitors (180, 185) to block DC bias signals from the receiving circuit.

Figure 1C:
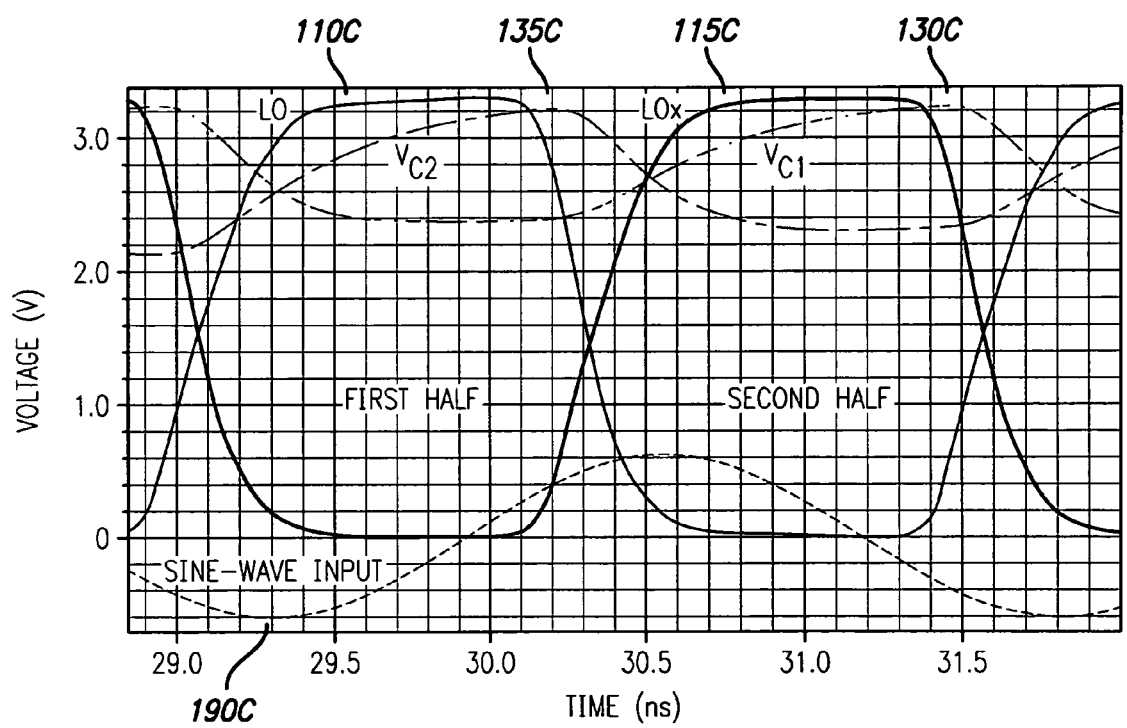
FIG. 1C shows voltage waveforms associated with operation of the driver shown in FIG. 1A.
Figure 2:
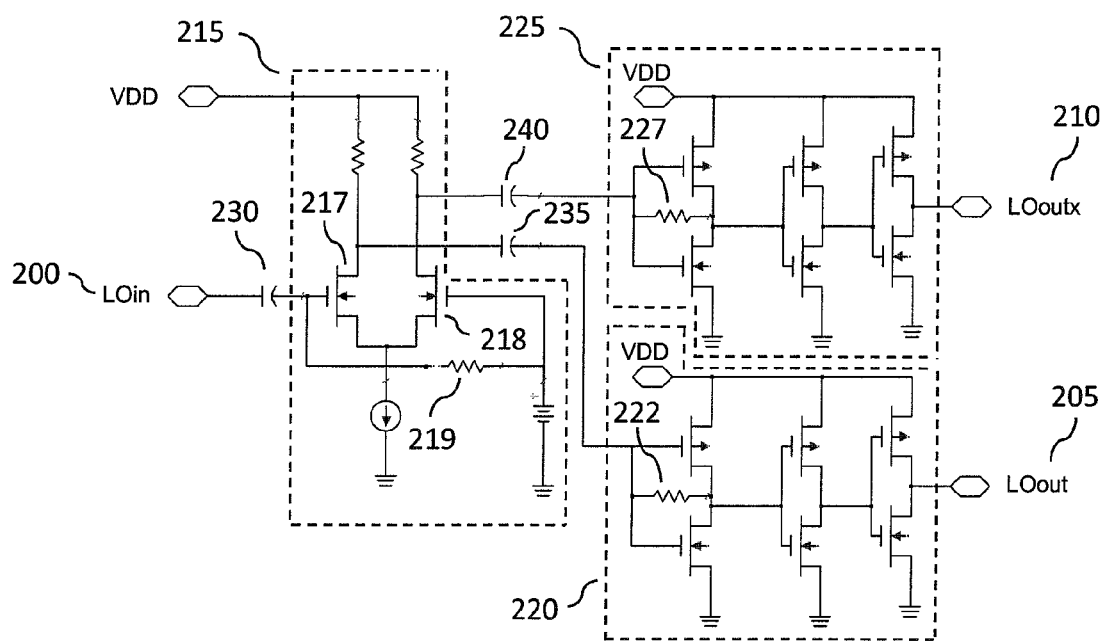
FIG. 2 shows an exemplary implementation of a sine to square wave converter circuit that can be used in conjunction with the driver shown in FIGS. 1A and 1B.

Reference is now made to FIG. 1C, which provides voltage waveforms (110c, 115c, 130c, 135c, 190c) associated with operation of the driver shown in FIG. 1A. According to many embodiments of the present disclosure, the LO signals (110c, 115c) are generally square waves, which can be generated from a sinusoidal input (190c) via, for example, a sine to square wave converter unit. An exemplary sine to square wave converter circuit is shown in FIG. 2. As shown in FIG. 1C, exemplary voltage of the high voltage state can be $+V_{DD}\approx 3.3$ V while the low voltage state can be around 0 V.

When the LO signal (110c) is in a high voltage state (also referred to as a first half of the LO cycle), voltage (135c) of the second capacitor (135) is being charged to $V_{DD}$ (100) while the first capacitor (130), which has been charged to $V_{DD}$ (100), shares its voltage (130c) with a fifth transistor (150) and a sixth transistor (155), thus closing (switching ON) the fifth and sixth transistors (150, 155). A first output terminal $V_G$ (170) is tied to the fifth transistor (150) while a second output terminal $V_S$ (175) is tied to the sixth transistor (155). The voltage $V_{DD}$ across the first capacitor (130) is provided to the first output terminal $V_G$ (170) and the second output terminal $V_S$ (175), where $V_{GS}=V_G-V_S=V_{DD}$.

Similarly, when the LO signal (110) is in a low voltage state (also referred to as a second half of the LO cycle), voltage (130c) of the first capacitor (130) is being charged to $V_{DD}$ (100) while the second capacitor (135), which has been charged to $V_{DD}$ (100), shares its voltage (135c) with a seventh transistor (160) and an eighth transistor (165), thus closing (switching ON) the seventh and eighth transistors (160, 165). In this case, the first output terminal $V_G$ (170) is tied to the eighth transistor (165) while the second output terminal $V_S$ (175) is tied to the seventh transistor (160). The voltage $V_{DD}$ across the second capacitor (135) is provided to the first output terminal $V_G$ (170) and the second output terminal $V_S$ (175), where $V_{GS}=V_G-V_S=-V_{DD}$.

The driver is adapted to provide the voltages $V_G$ (170) and $V_S$ (175) to a receiving circuit (not shown in FIG. 1A). In the case of a mixer, the voltages $V_G$ (170) and $V_S$ (175) are provided to a gate and a source, respectively, of one or more mixer transistors. Consequently, when the LO signal (110) is in a low voltage state, leading to $V_{GS}=-V_{DD}$, the mixer transistor can be switched OFF in the case of an n-type FET. When the LO signal (110) is in a high voltage state, leading to $V_{GS}=V_{DD}$, the mixer transistor can be switched ON in the case of an n-type FET. The ON and OFF states would be reversed in the case of a p-type FET.

According to many embodiments of the present disclosure, one of the first and second capacitors (130, 135) are fully charged to $V_{DD}$ within each of the first and second halves of the LO cycle.

In other embodiments of the present disclosure, one or more of the transistors (120, 125, 140, 145, 150, 155, 160, 165) can be replaced with a stack of transistors to improve withstand voltage of the driver itself. Specifically, when high voltages are applied to the receiving circuit, the transistors (120, 125, 140, 145, 150, 155, 160, 165) can see and withstand stress from the high voltages. The term "high voltage" generally refers to voltages higher than withstand voltage across a single transistor (e.g., maximum voltage of $V_{DS}$ for a FET). Exemplary voltages of around 5 V and higher are possible.

Although the preceding discussion made reference to a mixer and its associated mixer transistors, it should be noted the driver can also be coupled other devices such as power amplifiers and switching circuits. Each of these exemplary circuits can be associated with a high voltage RF signal.

Local oscillator (LO) frequency range involved in specific applications in which the driver is to be employed determines design parameters, such as output impedance, of the driver. While an initial LO signal is generally an input sine wave, an LO buffer circuit is generally utilized to convert the input sine wave to a square wave suitable for driving switching devices, such as transistors. For instance, the signals LO (110) and LOx (115) of FIG. 1A may have been sine waves that have been converted to square waves.

FIG. 2 shows an exemplary implementation of a sine to square wave converter circuit for converting an input sine wave (200) into a square wave at output terminals LOout (205) and LOoutx (210). The square wave at the first output terminal LOout (205) and the square wave at the second output terminal LOoutx (210) are complementary to each other, such that when the square wave of one is in a high voltage state, the square wave of the other is in a low voltage state. The square waves at LOout (205) and LOoutx (210) can be utilized as the inputs LO (110) and LOx (115) shown in FIGS. 1A and 1B.

The converter circuit comprises a differential pair (215) for steering current through either a first transistor (217) or a second transistor (218), a first set of inverters (220) for amplifying and/or buffering voltage to be applied to a load circuit (not shown) via the first output terminal LOout (205), and a second set of inverters (225) for amplifying and/or buffering voltage to be applied to a load circuit (not shown) via the second output terminal LOoutx (210). Gates of the first and second transistors (217, 218) of the differential pair (215) can be coupled via an inductor (not shown) and/or a resistor (219). In general, impedance coupling between the first and second transistors (217, 218) can be implemented through resistive and/or reactive elements such that the impedance is generally high at higher (e.g., RF) frequencies.

The differential pair (215) generally amplifies the input sine wave (200) and generates a squared version of the input sine wave (200) and a complement of the squared version of the input sine wave (200). The first set of inverters (220) can then receive as input the squared version while the second set of inverters (225) can receive as input the complement of the squared version, or vice versa.

A first inverter of each of the first (220) and second (225) set of inverters can include a bias setting resistor (222, 227) tied between gate to drain of the transistors in the first inverters to aid in providing sufficient voltage for switching the first inverters. As shown in FIG. 2, inverters subsequent to the first inverter generally need not include a bias setting resistor since voltage applied to the subsequent inverters has been amplified by the first inverter and is generally sufficient for switching the subsequent inverters. However, bias setting resistors can be added to these subsequent inverters.

Capacitors (230, 235, 240) can precede each of the differential pair (215), the first set of inverters (220), and the second set of inverters (225), respectively. These capacitors (230, 235, 240) are used as DC blocking capacitors, which prevent DC bias from and to each of the respective components (215, 220, 225).

If the input signal (200) were a square wave, the first (220) and second (225) set of inverters can still be used for amplifying and/or buffering squared versions of the input signal (200), but the differential pair (215) can be removed.

Figure 3:
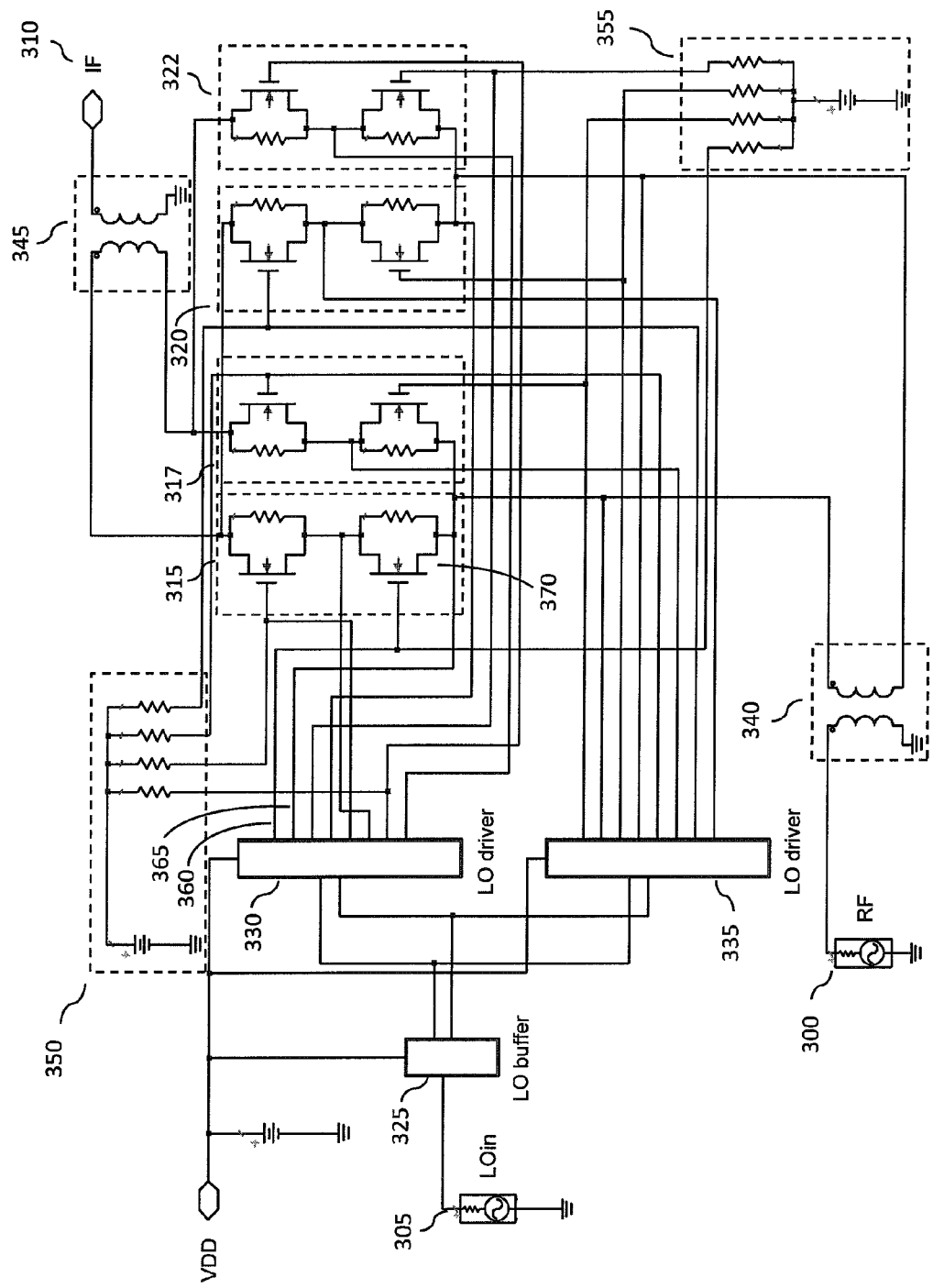
FIG. 3 shows an embodiment of a mixer circuit that comprises a plurality of drivers, where each driver can be the driver shown in FIGS. 1A and 1B.

FIG. 3 shows an embodiment of a mixer circuit adapted to take as input an input radio frequency (RF) signal (300) and an input LO signal (305) and generate an intermediate frequency. (IF) signal (310) based on voltages output from a plurality of mixer transistors (315, 317, 320, 322). In the case that the input LO signal (305) is a sine wave, an LO buffer circuit (325) for amplifying and/or buffering the input LO signal (305) can additionally convert the sine wave to a square wave. The exemplary sine to square wave converter of FIG. 2 can be utilized. A resistor tied drain to source in each mixer transistor can be utilized to keep a midpoint between the mixer transistors at a known DC bias.

Impedance matching circuits (340, 345), which are baluns (for balanced to unbalanced conversion) in this case, are utilized at both the RF (300) and IF (310) terminals. Specifically, a first impedance matching transformer (340) is utilized to match impedances between the RF terminal (300) and the LO components (305, 315, 317, 320, 322, 325, 330, 335) and similarly, a second impedance matching transformer (345) is utilized to match impedances between the IF terminal (310) and the LO components (305, 315, 317, 320, 322, 325, 330, 335). Although impedance matching transformers (340, 345) are shown in FIG. 3, other matching circuits such as, by way of example and not of limitation, L-section, single stub, and double stub can be used.

Bias circuits (350, 355) can be used to provide a DC bias to the gates of the mixer transistors while providing a high impedance to signals at the LO frequency. Although FIG. 3 utilizes resistors in implementing these bias circuits (350, 355), inductors with high impedance at the LO frequency may generally be utilized in conjunction with or alternative to resistors.

The LO buffer circuit (325) provides two complementary waves, generally two complementary square waves, to a plurality of drivers, where each driver, in turn, provides a gate voltage $V_G$ (e.g., 360) and a source voltage $V_S$ (e.g., 365) to a mixer transistor (e.g., 370). In FIG. 3, the LO buffer circuit (325) provides the two complementary waves to LO driver blocks (330, 335), where each LO driver block (330, 335) comprises a plurality of drivers. The drivers, in turn, provide a gate voltage $V_G$ and a source voltage $V_S$ to one of the mixer transistors in the plurality of mixer transistors (315, 317, 320, 322) shown in FIG. 3.

Depending on the state of the square wave provided to the driver, the driver either fully switches ON a mixer transistor or fully switches OFF a mixer transistor. Each of the LO driver blocks (330, 335) includes four drivers, with each driver generating $V_G$ and $V_S$ signals to be applied to a mixer transistor. A resistor tied drain to source for each mixer transistor in the plurality of mixer transistors (315, 317, 320, 322) maintains a DC bias for each mixer transistor.

In some embodiments of the present disclosure, as shown in FIG. 3, each mixer transistor can be provided with one driver. By providing one driver per mixer transistor, isolation between the $V_{GS}$ signals generated by each of the drivers in the LO driver blocks (330, 335) is generally improved. It should be noted that the DC capacitors (180, 185) shown in FIG. 1B also improve isolation by blocking DC bias signals between the various drivers as well as between each driver and the various components shown in FIG. 3.

The isolation from the DC capacitors (180, 185 in FIG. 1B) between the $V_{GS}$ signals allows the $V_{GS}$ signals to swing from positive to negative (e.g., $+V_{DD}$ to $-V_{DD}$) without being restricted by absolute value chosen for the high voltage supply $V_{DD}$ (100 in FIG. 1A) and a low voltage supply $V_{SS}$, which is denoted as ground (105 in FIG. 1A). Specifically, the DC capacitors (180, 185 in FIG. 1B) prevent DC bias from $V_{DD}$ and ground from coupling with the gate and source terminals of the mixer transistors.

It should be noted that FIG. 3 shows a double-balanced mixer configuration with each of the transistor stacks (315, 317, 320, 322) forming a part of a bridge circuit. Voltages from the LO driver blocks (330, 335) generally either switch ON all transistors in a first transistor stack (315) and a fourth transistor stack (322) or switch OFF all the transistors in the first (315) and fourth (322) transistor stacks. Similarly, voltages from the LO driver blocks (330, 335) generally either switch ON or switch OFF all transistors in a second transistor stack (317) and a third transistor stack (320). Instead of utilizing a double-balanced mixer configuration, two of the transistor stacks can be removed (keeping, for instance, only stacks 315 and 317) to yield a single-balanced mixer configuration. Other mixer configurations identifiable by a person skilled in the art are also possible.

The IF signal (310) is generated by the system of FIG. 3 based on a voltage provided by the plurality of mixer transistors (315, 317, 320, 322). Although each stack (315, 317, 320, 322) includes two transistors in FIG. 3, other embodiments may include additional transistors added to each stack (315, 317, 320, 322). In other embodiments, each transistor stack (315, 317, 320, 322) shown in FIG. 3 can be replaced with only one mixer transistor. Also, each stack (315, 317, 320, 322) can include a different number of transistors.

Figure 4:
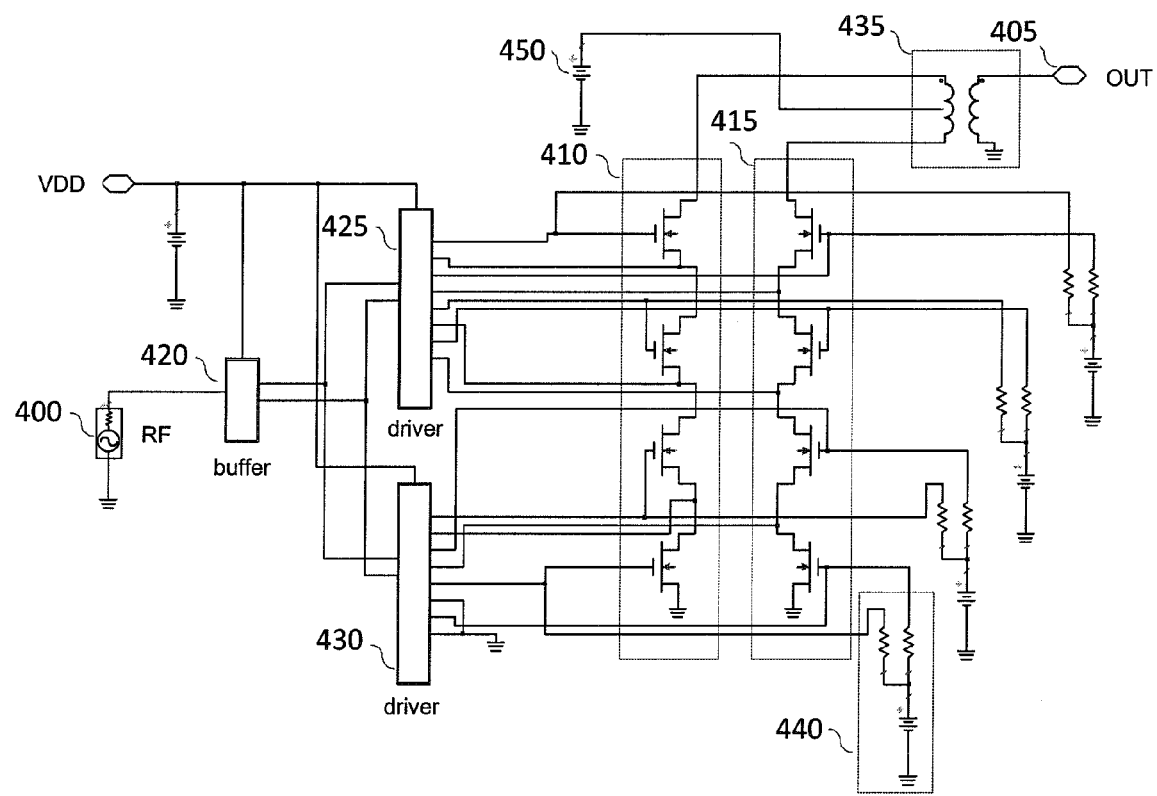
FIG. 4 shows an embodiment of a power amplifier that comprises a plurality of drivers, where each driver can be the driver shown in FIGS. 1A and 1B.
Figure 5:
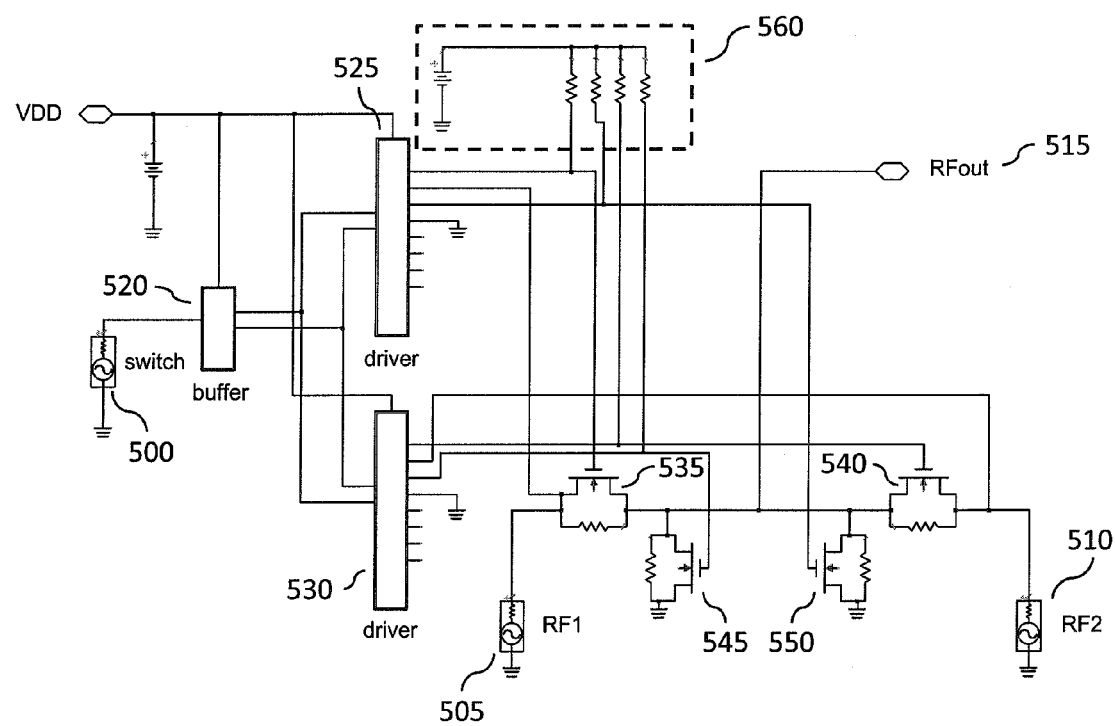
FIG. 5 shows an embodiment of a switching circuit that comprises a plurality of drivers, where each driver can be the driver shown in FIGS. 1A and 1B.

Design of any system, such as those shown in FIGS. 3-5, takes into consideration switching speed of the transistors. For the mixer shown in FIG. 3, frequency range of each of the RF signal, LO signal, and IF signal is generally set by transistor technology used. Exemplary frequency values can be an LO signal of 82.6 MHz, RF signal of 94.3 MHz, and IF signal of 11.7 MHz, although lower or higher frequencies for each of these signals are possible.

Ideally, a stack with two transistors would have an extra power handling of 3 dB (double) that of a stack of only one transistor. With regards to FIG. 3, this signifies that, ideally, the mixer with the stacks of two transistors (315, 317, 320, 322) would have an extra power handling of 3 dB over a mixer with a stack of one transistor. However, losses inherent in various devices of the mixer, including the mixer transistors themselves, show less extra power handling than expected (for instance, extra power handling of 2 dB has been observed). These losses are generally from parasitic capacitances and on-resistances present in the mixer transistors.

In many embodiments of the present disclosure, the drivers (330, 335) coupled with the transistor stacks (315, 317, 320, 322) can achieve equal voltage sharing across each transistor in the transistor stack by improving isolation between the devices as well as providing a large impedance relative to impedance of the transistors.

In a particular implementation of the mixer circuit shown in FIG. 3, a 0.25 μm CMOS process (i.e., gate length used to create transistors is 0.25 μm) is utilized for each of the mixer transistors. A high voltage supply $V_{DD}$ of 3.3 V (or lower) is generally utilized. In steady-state operation, the double-balanced mixer configuration formed by the stack of two transistors (315, 317, 320, 322) has been shown, through simulation, to exhibit a conversion loss of 6 dB, 26 dBm input from the RF terminal (300) associated with 1 dB gain compression at the output, and 470 mW power consumption. The simulation was performed with an LO frequency of 1 GHz, RF frequency of 1.1 GHz, and an IF frequency of 0.1 GHz.

Conversion loss refers to a ratio $P_{IF}/P_{RF}$, where $P_{IF}$ is power at the IF terminal (310) and $P_{RF}$ is power at the RF terminal (300). Compression refers to the mixer circuit deviating from linear gain response. The mixer circuit can generally operate up to 2000 MHz for the LO frequency, depending on the balun design used (e.g., frequency dependency of the balun, amplitude split and phase difference provided by the balun, and so forth).

For comparison, a 0.18 μm CMOS process (i.e., gate length used to create transistors is 0.18 μm) can be utilized for each of the mixer transistors. The double-balanced mixer configuration formed by the stack of two transistors (315, 317, 320, 322) exhibited a conversion loss of 6.6 dB, 25 dBm input 1 dB compression, and 114 mW power consumption. The mixer circuit can operate at frequencies above 2000 MHz for the LO frequency. At shorter gate lengths, switching speed generally increases and thus higher operation frequencies can be utilized.

FIG. 4 shows an embodiment of a power amplifier adapted to take as input an input radio frequency (RF) signal (400) and provide an output signal, generally an amplified version of the input RF signal (400), to an output terminal (405) via a first and second transistor stack (410, 415). The transistor stacks (410, 415) are utilized to provide a large output and to increase voltage withstand due to the large output. The output terminal (405) can be connected to a receiving circuit, which can be, for example, an antenna adapted to transmit the amplified version of the input RF signal (400). Although not shown, a drain-to-source resistor can be coupled drain to source for one or more transistors in each transistor stack (410, 415).

Operation of the power amplifier is as follows. The input RF signal (400) is provided to a buffer circuit (420), which can be, for example, the sine to square wave converter circuit shown in FIG. 2. The buffer circuit (420) provides two complementary waves, generally two complementary square waves, to a plurality of drivers, where each driver, in turn, provides a gate voltage $V_G$ and a source voltage $V_S$ to a transistor in the first and second transistor stack (410, 415). In such cases, the output terminal (405) generally provides a square wave to a receiving circuit.

In FIG. 4, the buffer circuit (420) provides the two complementary waves to driver blocks (425, 430), where each driver block (425, 430) comprises a plurality of drivers. The drivers, in turn, provide a gate voltage $V_G$ and a source voltage $V_S$ to one of the transistors in the first and second transistor stack (410, 415). Depending on the state of the square wave provided to the driver, the driver either completely switches ON a transistor or completely switches OFF a transistor. Each of the driver blocks (425, 430) includes four drivers, with each driver generating $V_G$ and $V_S$ signals to be applied to a transistor.

Similar to the discussion of the mixer circuit in FIG. 3, in some embodiments of the power amplifier of the present disclosure, as provided in FIG. 4, each transistor can be provided with one driver. This can improve isolation between the drivers and the transistors in the first and second transistor stack (410, 415).

The amplified RF signal is provided to the output terminal (405) when either the first transistor stack (410) or the second transistor stack (415), or both, are switched ON by the driver blocks (425, 430). An impedance matching circuit (435), such as a balun (435) shown in FIG. 4, can be utilized to match the receiving circuit (not shown) tied to the output terminal (405) with the various components shown in FIG. 4. When a transistor stack (410, 415) is switched ON, current can be conducted from a DC supply (450) to ground. This alternating current can be converted to the RF output signal (405) by the balun (435). The DC supply (450) can be applied via a center-tap in the balun (435).

Combination of ON and OFF transistor stacks (410, 415) can be in one of four states. In a first case, all transistors in the first transistor stack (410) are ON whereas all transistors in the second transistor stack (415) are OFF. In a second case, all transistors in the first transistor stack (410) are OFF whereas all transistors in the second transistor stack (415) are ON. The output signal (405) in the first and second cases is complementary to each other. In a third case, both transistor stacks (410, 415) are OFF, and thus the input RF signal (400) is not coupled with the output terminal (405). In a fourth case, both transistor stacks (410, 415) are ON, which can be a useful configuration when the power amplifier is being utilized to implement a heating device.

Bias circuits (such as 440) can be used to provide a DC bias to the gates of the transistors while providing a high impedance to signals at the frequency of the input signal (400). Such bias circuits can generally be implemented using resistors and/or inductors.

FIG. 5 shows an embodiment of a switching circuit adapted to take as input an input signal (500), a first RF input (505), and a second RF input (510) and output an output signal to an output terminal (515). The output terminal (515) is tied to a receiving circuit (not shown). Either one of the first RF input (505) or the second RF input (510) can be coupled to the output terminal (515). The input signal (500) controls which RF input (505, 510) is coupled to the output terminal (515). Bias circuits (560) can be used to provide a DC bias to the gates of the transistors (535, 540, 545, 550) while providing a high impedance to signals at the frequency of the input signal (500). Such bias circuits can generally be implemented using resistors and/or inductors.

Operation of the switching circuit is as follows. In general, the input signal (500) is a square wave. The input signal (500) is provided to a buffer circuit (520), which can include, for example, the sine to square wave converter circuit shown in FIG. 2 if the input signal (500) were not a square wave.

In FIG. 5, the buffer circuit (520) provides the two complementary waves to driver blocks (525, 530), where each driver block (525, 530) comprises a plurality of drivers. Each driver, in turn, provides a gate voltage $V_G$ and a source voltage $V_S$ to one of the transistors (535, 540, 545, 550). Depending on the state of the square wave provided to the driver, the driver either fully switches ON a transistor or fully switches OFF a transistor. Each of the driver blocks (525, 530) includes four drivers, with each driver generating $V_G$ and $V_S$ signals to be applied to a transistor. A resistor tied drain to source for each transistor (535, 540, 545, 550) maintains a DC bias for each transistor (535, 540, 545, 550). The resistor can also affect frequency response of the transistor.

In FIG. 5, each driver block (525, 530) comprises two drivers, where one driver provides voltages $V_G$ and $V_S$ while another driver provides voltage $V_G$ and sets $V_S$ to ground. The former driver applies the voltages $V_G$ and $V_S$ to series transistors (535, 540) while the latter driver applies the voltage $V_G$ to a gate of shunt transistors (545, 550) and ties to ground a source of shunt transistors (545, 550). The shunt switches (545, 550) can be used to improve isolation of the switching circuit by providing a ground for any parasitic components (e.g., parasitic capacitances) that conduct current even when corresponding series transistors (535, 540) are OFF. For instance, when a series switch (e.g., 535) is OFF, then a corresponding shunt switch (e.g., 545) is generally ON in order to ground any signals conducted by the series switch (e.g., 535) and thus improve isolation between the RF input (e.g., 505) and the output terminal (515).

In many embodiments of the present disclosure, each transistor (535, 540, 545, 550) can be implemented using transistor stacks to increase voltage withstand of the switching circuit. Additionally, a plurality of series switches and shunt switches may be utilized for each RF input.

As previously mentioned, although the present disclosure utilizes drivers for controlling transistor stacks in mixers, power amplifiers, and switches, other devices may also be implemented utilizing the drivers.

The examples set forth above are provided to give those of ordinary skill in the art a complete disclosure and description of how to make and use the embodiments of the methods and apparatuses for high power and/or high frequency devices of the disclosure, and are not intended to limit the scope of what the inventors regard as their disclosure. Modifications of the above-described modes for carrying out the disclosure may be used by persons of skill in the art, and are intended to be within the scope of the following claims. All patents and publications mentioned in the specification may be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing from the spirit and scope of the present disclosure. Accordingly, other embodiments are within the scope of the following claims.

The invention claimed is:

1. A circuital arrangement adapted to provide a first output voltage to a first output terminal and a second output voltage to a second output terminal, comprising:
   a first transistor configured to receive a first control voltage;
   a second transistor configured to receive a second control voltage;
   a first capacitor connected with the first transistor on one end and the second transistor on another end;
   a third transistor configured to receive the second control voltage;
   a fourth transistor configured to receive the first control voltage; and
   a second capacitor connected with the third transistor on one end and the fourth transistor on another end,
   wherein:
   the first capacitor is configured to store charge when the first transistor is switched on and is configured to couple a first capacitor voltage to the first output terminal when the first transistor is switched off, wherein the first and second output voltages are functions of the first capacitor voltage when the first transistor is switched off, and
   the second capacitor is configured to store charge when the third transistor is switched on and is configured to couple a second capacitor voltage to the second output terminal when the third transistor is switched off, wherein the first and second output voltages are functions of the second capacitor voltage when the third transistor is switched off.

2. The circuital arrangement according to claim 1, wherein:
   each of the first and second control voltages comprises a first state and a second state,
   when the first control voltage is in the first state, the third and fourth transistors are switched on, and
   when the first control voltage is in the second state, the first and second transistors are switched on.

3. The circuital arrangement according to claim 1, further comprising:
   a fifth transistor connected with the first capacitor and configured to receive the second control voltage;
   a sixth transistor connected with the first capacitor and configured to receive the first control voltage;
   a seventh transistor connected with the second capacitor and configured to receive the first control voltage; and
   an eighth transistor connected with the second capacitor and configured to receive the second control voltage,
   wherein:
   the first capacitor voltage is to be applied to the fifth and sixth transistors and is suitable for switching on the fifth and sixth transistors, and
   the second capacitor voltage is to be applied to the seventh and eighth transistors and is suitable for switching on the seventh and eighth transistors.

4. The circuital arrangement according to claim 3, wherein:
   each of the first and second control voltages comprises a first state and a second state,
   when the first control voltage is in the first state, the third and fourth transistors are switched on, and
   when the first control voltage is in the second state, the first and second transistors are switched on.

5. The circuital arrangement according to claim 4, wherein:
   when the first control voltage is in the first state, the fifth transistor is switched on and configured to couple one end of the first capacitor to the first output terminal and the sixth transistor is switched on and configured to couple another end of the first capacitor to the second output terminal, and
   when the first control voltage is in the second state, the seventh transistor is switched on and configured to couple one end of the second capacitor to the second output terminal and the eighth transistor is switched on and configured to couple another end of the second capacitor to the first output terminal.

6. The circuital arrangement according to claim 1, further comprising:
   a third capacitor coupled with the first capacitor, second capacitor, and first output terminal; and
   a fourth capacitor coupled with the first capacitor, second capacitor, and the second output terminal.

7. The circuital arrangement according to claim 1, wherein each of the first, second, third, and fourth transistors is either a field effect transistor or a bipolar junction transistor.

8. The circuital arrangement according to claim 1, wherein at least one of the first, second, third, and fourth transistors is serially connected with one or more serially-connected transistors.

9. The circuital arrangement according to claim 1, wherein the first control voltage is complementary to the second control voltage.

10. A mixer circuit adapted to generate an output signal based on a first input signal and a second input signal, comprising:
- a plurality of drivers, wherein an input to each driver is a function of the first input signal, and wherein each driver in the plurality of drivers is the circuital arrangement according to claim 1; and
- a bridge circuit connected with the plurality of drivers, wherein:
  - the bridge circuit comprises a plurality of transistors, and
  - the bridge circuit is adapted to receive the second input signal and is adapted to generate the output signal;
- wherein an output of each driver in the plurality of drivers controls state of each transistor in the plurality of transistors and each transistor is either in an on state or an off state.

11. The mixer circuit according to claim 10, wherein the output signal is of lower frequency than the first input signal and the second input signal.

12. The mixer circuit according to claim 10, wherein the bridge circuit comprises a plurality of transistor stacks, each transistor stack comprising one transistor or one or more serially-connected transistors.

13. An amplifier circuit adapted to generate an output signal based on an input signal, comprising:
- a plurality of drivers, wherein an input to each driver is a function of the input signal, and wherein each driver in the plurality of drivers is the circuital arrangement according to claim 1; and
- a plurality of transistor stacks connected with the plurality of drivers and adapted to generate the output signal,
- wherein an output of each driver in the plurality of drivers controls state of each transistor in the plurality of transistor stacks and each transistor is either in an on state or an off state.

14. A switching circuit adapted to receive a first input signal and a second input signal and either transmit the second input signal to an output terminal or ground the second input signal, comprising:
- a plurality of drivers, wherein an input to each driver is a function of the first input signal, and wherein each driver in the plurality of drivers is the circuital arrangement according to claim 1;
- a first transistor configured to receive the second input signal; and
- a second transistor coupled with the first transistor, wherein:
  - an output of each driver in the plurality of drivers controls state of each of the first and second transistor and each transistor is either in an on state or an off state,
  - when the first transistor is switched on, the switching circuit is configured to transmit the second input signal to the output terminal, and
  - when the second transistor is switched on, the switching circuit is configured to ground the second input signal.

15. A method for providing a first output voltage and a second output voltage to a receiving circuit, comprising:
- providing a first transistor, a second transistor, a third transistor, and a fourth transistor;
- providing a first capacitor connected with the first transistor on one end and the second transistor on another end;
- providing a second capacitor connected with the third transistor on one end and the fourth transistor on another end;
- applying a first control voltage to the first and fourth transistors, the first control voltage controlling state of the first and fourth transistors;
- applying a second control voltage to the second and third transistors, the second control voltage controlling state of the second and third transistors;
- generating the first output voltage based on voltage across the first capacitor; and
- generating the second output voltage based on voltage across the second capacitor, wherein the state of each transistor is either an on state or an off state.

16. The method according to claim 15, wherein:
the generating the first output voltage comprises:
- charging the first capacitor when the first transistor is switched on, and
- coupling the first capacitor to the receiving circuit when the first transistor is switched off, wherein the voltage across the first capacitor is based on the charging; and the generating the second output voltage comprises:
- charging the second capacitor when the third transistor is switched on, and
- coupling the second capacitor to the receiving circuit when the first transistor is switched off, wherein the voltage across the second capacitor is based on the charging.

17. The method according to claim 15, wherein the first control voltage and the second control voltage are complementary voltages.

18. The method according to claim 15, wherein at least one of the provided first, second, third, and fourth transistors is serially connected with one or more serially-connected transistors.

19. The method according to claim 15, further comprising:
providing a fifth transistor, a sixth transistor, a seventh transistor, and an eighth transistor, wherein:
- the fifth transistor is connected with the first transistor and the first capacitor,
- the sixth transistor is connected with the second transistor and the first capacitor,
- the seventh transistor is connected with the third transistor and the second capacitor, and
- the eighth transistor is connected with the fourth transistor and the second capacitor;

applying the first control voltage to the sixth and seventh transistors, the first control voltage controlling state of the sixth and seventh transistors;
applying the second control voltage to the fifth and eighth transistors, the second control voltage controlling state of the fifth and eighth transistors;
generating the first output voltage based on voltage across the first capacitor; and
generating the second output voltage based on voltage across the second capacitor,
wherein:
- the state of each transistor is either an on state or an off state,
- the first output voltage is further based on state of the fifth transistor and the eighth transistor, and
- the second output voltage is further based on state of the sixth transistor and the seventh transistor.

20. The method according to claim 15, wherein the first control voltage is complementary to the second control voltage.

* * * * *